United States Patent
Colgan et al.

(10) Patent No.: US 8,569,874 B2
(45) Date of Patent: Oct. 29, 2013

(54) HIGH MEMORY DENSITY, HIGH INPUT/OUTPUT BANDWIDTH LOGIC-MEMORY STRUCTURE AND ARCHITECTURE

(75) Inventors: Evan G. Colgan, Chestnut Ridge, NY (US); Monty M. Denneau, Puddingdale, NY (US); Sampath Purushothaman, Yorktown Heights, NY (US); Klmberley A. Kelly, Pleasant Valley, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 411 days.

(21) Appl. No.: 13/043,749

(22) Filed: Mar. 9, 2011

(65) Prior Publication Data

US 2012/0233510 A1 Sep. 13, 2012

(51) Int. Cl.
*H01L 23/66* (2006.01)
*H01L 23/64* (2006.01)

(52) U.S. Cl.
USPC ................ 257/686; 257/730; 257/E23.01

(58) Field of Classification Search
None
See application file for complete search history.

(56) References Cited

U.S. PATENT DOCUMENTS

| | | | |
|---|---|---|---|
| 5,397,747 A * | 3/1995 | Angiulli et al. | 438/109 |
| 5,530,623 A * | 6/1996 | Sanwo et al. | 361/788 |
| 5,702,984 A | 12/1997 | Bertin et al. | |
| 5,910,682 A * | 6/1999 | Song | 257/685 |
| 6,005,776 A * | 12/1999 | Holman et al. | 361/760 |
| 7,217,994 B2 | 5/2007 | Zhu et al. | |
| 7,236,633 B1 | 6/2007 | Lewis et al. | |
| 7,429,782 B2 * | 9/2008 | Brunnbauer et al. | 257/678 |
| 7,518,225 B2 | 4/2009 | Emma et al. | |
| 8,247,895 B2 * | 8/2012 | Haensch et al. | 257/686 |
| 8,330,262 B2 * | 12/2012 | Colgan et al. | 257/686 |

OTHER PUBLICATIONS

Black et al. "Die Stacking (3D) Microarchitecture"; ACM Digital Library/IEEE; 2006.
Lenovo et al. "System Memory Optimizer"; IP.COM/IBM TDB; Apr. 22, 2008.
Yorozu et al; "Design and Implementation of an RSFQ Switching Node for Petaflops Networks"; INSPE/IEEE; vol. 9, No. 2, pp. 3557-3560; Jun. 1999.

* cited by examiner

*Primary Examiner* — Thomas L Dickey
*Assistant Examiner* — Joseph Schoenholtz
(74) *Attorney, Agent, or Firm* — Cantor Colburn LLP; William Stock

(57) ABSTRACT

A chip stack structure includes a logic chip having an active device surface, and memory slices of a memory unit vertically aligned such that a surface of the memory slices is oriented perpendicular to the active device surface of the logic chip. The chip stack structure also includes wiring patterned on an upper surface of the memory slices, the wiring electrically connecting memory leads of the memory slices to logic grids corresponding to logic grid connections of the logic chip.

19 Claims, 6 Drawing Sheets

US 8,569,874 B2

HIGH MEMORY DENSITY, HIGH INPUT/OUTPUT BANDWIDTH LOGIC-MEMORY STRUCTURE AND ARCHITECTURE

This invention was made with Government support under Contract No. H98230-08-C-1468 awarded by the Maryland Procurement Office (MPO). The Government has certain rights in this invention.

BACKGROUND

The present invention relates to computer and processor structure and architecture and, more specifically, to a high memory density, high input/output (I/O) bandwidth logic-memory architecture.

Logic-memory devices employing a 4D integration (4DI) structure provide for a large number of memory cells to be located in close proximity to logic cores, thereby reducing signal delays, achieving optimum logic-memory arrangement, and improving performance. There is a long history in microelectronics to strive for better logic-memory architecture to improve system performance by reducing so called logic-memory bottle-neck. Logic-memory bottleneck arises from either slow or insufficient memory to keep up with the faster logic, leaving the logic with long periods of time idling for data. This is particularly a problem for high-end systems in which large numbers of chips are devoted to high counts of multi-core logic while demanding even more space for memory at close proximity. Prior to 4DI implementations, multi-chip modules (MCM), precision aligned macros (PAM), and 3D integration (3DI) structures were widely used in logic-memory devices to improve logic-memory delays. MCM uses logic and memory as separate chips but mounted on the same chip carrier. The chip-to-chip communications are through conventional flip chip connections and wiring disposed within or atop the chip carrier. PAM on the other hand accurately aligns the logic and memory chips onto a carrier wafer and then adds fine pitch back-end-of-the-line (BEOL) wiring across the chips to make the connection. PAM allows higher input/output (I/O) than MCM between the logic-memory chips. There are two versions of 3DI which provide improvements over MCM and PAM. 3DI-stacking stacks the memory into a nearly cube form. There are no direct connections between the memories. Instead, all memory leads are wired to the chip edges and then wire bonded to a logic chip. In this format, the amount of memory in the stack in a given silicon foot print (also referred to as memory density) can be very high but the I/O density is low. 3DI-TSV (through-Si-via) architecture involves stacking a number of memory layers onto a logic unit whereby the memory stack is disposed on the logic unit in a parallel formation with the logic unit and the TSV connects between the chip layers. 3DI-TSV architecture was considered to provide benefits over traditional 2D planar devices in that more device memory layers were enabled through the 3DI architecture with a very high I/O bandwidth. The amount of memory stackable in the 3DI approach is, however, less than what is possible in the memory cube configuration due to the silicon area required for the TSV connections as well as the complexity of layer to layer connections encountered with increased memory layer counts.

A 4DI structure, which is a combination of 3DI-stacking (with high memory density) and 3DI-TSV (with high I/O density), enables large memory density in close proximity of a large number of logic cores in a super-performance computing architecture. The 4DI logic-memory arrangement includes vertically arranging memory slices of a memory stack below a logic unit whereby the vertical arrangement of memory slices are perpendicular to the logic unit, thereby enabling a greater number of memory devices to reside in the combined structure. This 4DI logic-memory arrangement also provides both high bandwidth and high memory density in very close proximity to the processor cores with a much reduced process complexity.

In high performance 4DI systems, however, a single logic core requires hundreds of I/O connections and there are hundreds or thousands of cores per logic chip. These large numbers of logic I/Os need to be wired and connected to each of their memory stacks through fine pitch area array type connections, such as a transfer-join (TJ) connection or a micro-C4 (uC4) connection. As the 4DI memory stacks are assembled from dozens of individual memory wafers, oftentimes there is misalignment and/or distortions that occur such that the position of device elements becomes skewed relative to their connective counterparts.

In another implementation, each of the 4DI slices in the vertical stack contains both logic cores and memory as in a conventional 2D architecture. The top horizontal chip contains logic cores and/or crossbar switching elements which direct and collect data to and from the vertical slices. The top logic/crossbar chip is provided with fine pitch (through TJ or uC4) arrays which are connected to the vertical memory/logic slices. Again, oftentimes there is misalignment and/or distortions that occur in the 4DI stack such that the position of device elements becomes skewed relative to their connective counterparts.

SUMMARY

According to one embodiment of the present invention, a chip stack structure is provided. The chip stack structure includes a logic chip having an active device surface. The chip stack structure also includes memory slices of a memory unit vertically aligned such that an active device surface of the memory slices is oriented perpendicular to the active device surface of the logic chip. The chip stack structure also includes wiring patterned on an upper surface of the memory slices, the wiring correcting distortions occurring from a slicing and assembly process of the memory slices. The wiring electrically connects memory leads of the memory slices to logic grids corresponding to logic grid connections of the logic chip.

According to another embodiment of the present invention, a method for identifying and correcting distortions in a stacked memory unit resulting from a stack building process for a logic-memory device is provided. A method includes scanning the stacked memory unit to identify any distortions resulting from the memory stack building process, the distortions identified by locating a current position of each of a number of memory slices relative to others of the memory slices and calculating a skew value representing a difference between a current position of leads of the memory slices and a pre-planned position of the leads. Responsive to determining a distortion exists from the scanning, the method also includes correcting the distortion using the skew value by laser direct writing a connection between each of a number of logic grid connections and corresponding leads on the memory slices.

According to a further embodiment of the present invention, a chip stack structure is provided. The chip stack structure includes a crossbar chip having an active device surface. The chip stack structure also includes a number of combined memory and processor slices of a processor memory unit vertically aligned such that an active device surface of the combined memory and processor slices is oriented perpendicular to the active device surface of the crossbar chip. Electrical interconnects are formed between devices on the active surface of the crossbar chip and devices on the active surface of the combined memory and processor slices by connections on an upper wiring surface of the combined memory and processor slices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification.

The forgoing and other features, and advantages of the invention are apparent from the following detailed description taken in conjunction with the accompanying drawings in which.

DETAILED DESCRIPTION

An exemplary embodiment provides a logic-memory device and architecture for high memory density, high input/output (I/O) bandwidth in close proximity to logic cores. The architecture enables the logic-memory device to achieve a high I/O bandwidth and memory density to each of its cores through a unique logic chip-to-memory connection. In an exemplary embodiment, the logic-memory device and architecture provides for a maskless writing means that is configured to correct distortions occurring from a slicing and assembly process of device's memory slices by patterning wiring disposed on a surface of the memory slices. In one embodiment, the maskless writing means includes an optical imaging scanner (optical laser). In another embodiment, the maskless writing means includes a direct laser lithography device.

In the following description, when an exemplary reference is made to a memory unit in the vertical stacked structure it should be understood that the same could include a logic and memory unit. Similarly, the exemplary reference to the logic unit which is the top chip should be viewed to include structures where in the top chip is a combination of a crossbar connection and logic chip as well.

Figure 1:
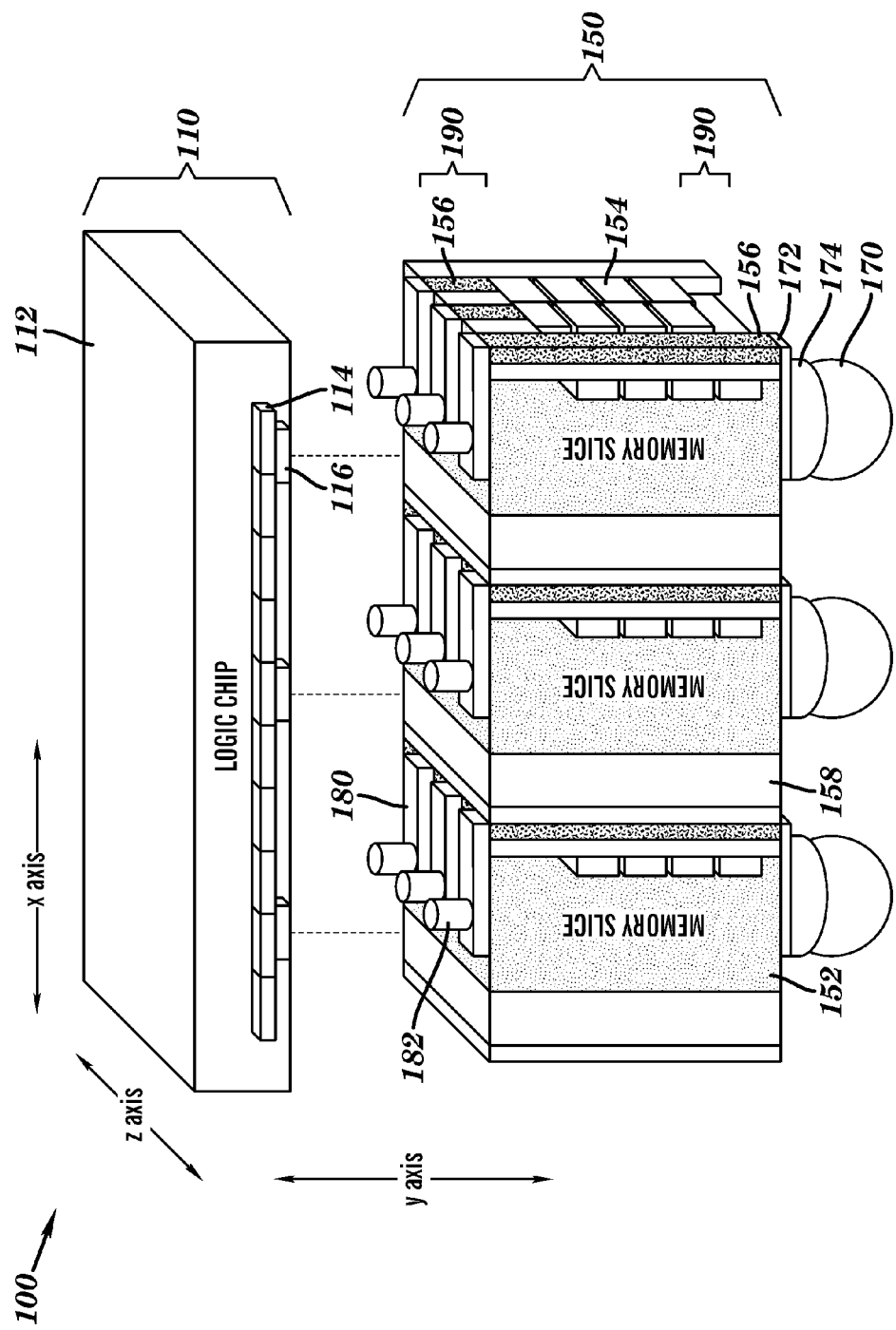
FIG. 1 is a schematic diagram of a logic-memory device with the logic-to-memory fine pitch connections depicted as transfer-join (T&J) or lock-n-key area connections in an exemplary embodiment.

With reference now to FIG. 1, a schematic diagram of an exemplary logic-memory device 100 will now be described in an exemplary embodiment. The logic-memory device 100 is shown in FIG. 1 as having logic-to-memory fine pitch connections (depicted as transfer-join (T&J) or lock-n-key area connections). However, it will be understood that other configurations are possible in order to realize the advantages of the exemplary embodiments. For example, the logic-memory device 100 may include a top element comprised of a logic die containing crossbar switches, and a bottom element comprised of vertical chip stacks with logic and memory on each of the vertical slices.

Logic-memory device 100 (also referred to herein as "device") includes a logic unit 110, a memory unit 150, and input/output (I/O) interconnect components. In an exemplary embodiment, and as shown and described in FIG. 1, the logic-memory device 100 is a 4D integration (4DI) device.

The logic unit 110 includes a chip that is comprised of a substrate 112 on which a number of microprocessor logic units (cores) 114 are disposed. Various contact recesses 116 are formed on the substrate 112 in order to provide an alignment and communicative coupling between the logic unit 110 and the memory unit 150. The logic unit 110 is shown lengthwise along a horizontal axis (e.g., x axis) in the FIG. 1. The logic 110 includes a lower planar surface (not shown) that faces an upper surface of the memory unit (150). The lower planar surface is referred to herein as an active device surface as it contains the logic cores and other devices and is configured to be coupled with the memory unit 150 as will be described herein.

The vertical memory slices or the vertical logic/memory slices are typically ranging from 10 micron to 730 micron in thickness, with an optimum thickness of between 150 and 375 micron, where the slice thickness is in the x direction in FIG. 1. The vertical slice height can range from 1 mm to 20 mm with the optimum height of 2 mm to 3 mm, where the slice height is in the y direction in FIG. 1. The depth of the vertical slices in the z direction is typically equal to the width of the top logic chip 110 in that direction. The size of the 4DI logic-memory device 100 can be from 5 mm×5 mm to 50 mm×50 mm with the optimum size around 25 mm×25 mm in the x and z directions in FIG. 1, where z is perpendicular to x and y. The top logic chip can be a nominal 730 micron thickness in the y direction or being thinned to as little as 20 micron for reduced thermal resistance since heat extraction means such as a cooling hat and/or heat sink would be in contact with that chip in a system level assembly.

In an exemplary embodiment, the memory unit 150 is comprised of memory slices 152 which have been diced from layers of memory wafer in a memory stack (not shown) and each of the memory slices 152 has been flipped on its side such that a surface of each of the memory slices 152 that contains the wiring is aligned along a vertical axis (e.g., axis y of FIG. 1) and is referred to herein as an active device surface of the memory slices 152.

The memory slices 152 include memory banks 154 and leads 156 (e.g., I/O leads). Bonding layers 158 are formed on each of the memory slices 152. The memory slices 152 may be made of silicon (Si) or similar material. In one embodiment, the memory slices 152 represent static random access memory (SRAM) devices; however, it will be understood that the memory slices may be other types of memory devices, such as dynamic random access memory (DRAM), eDRAM (embedded DRAM), and/or memory combined with logic devices. The leads 156 include signal, power/ground and controls. The bonding material 158 may be polyimide (PI), epoxy, a combination of both, or other adhesives which are stable at elevated temperatures.

I/O interconnect components of the logic-memory device 100 may be implemented as a C4 (controlled collapse chip connection) package. In this embodiment, the C4 structure includes lead/tin, or other solder, balls 170 disposed over transition metallurgy pads 174 for providing interconnection between chip circuitries to various external elements. Also shown in the logic-memory device 100 of FIG. 1 is a wire connection lead 172 disposed between the C4 and the memory surface I/O. The wire connection lead 172 may connect to the memory directly or may connect to a pin (e.g., a fine-pitch join) to the top logic chip (110).

Each of the memory slices 152 includes an upper surface (also referred to as the upper wiring surface) that is disposed opposite to, and faces with, the logic unit 110 active device surface. Each of the memory slices 152 also includes a lower surface, also referred to as a lower wiring surface that faces the I/O components, such as a package substrate. As shown in FIG. 1, the upper wiring surface of the memory slice 152 includes fine pitch joins 182 that are configured to align with logic units 114 through the contact recesses 116. However, it will be understood that other configurations are possible, e.g., solder microjoins may be implemented instead of the fine pitch joins 182. The upper surface of each of the memory slices 152 also includes a logic grid connection 180 representing fan outs configured on a location of the upper surface of the memory slice 152 based upon a planned location of the leads 156, such that the logic grid connection 180 aligns with the leads 156 and connect to a regular array of fine pitch joins 182 that align and mate with landing contact recesses 116 on the logic chip 110. However, during the logic-memory device building process, (e.g., bonding memory wafers or chips together in a stack) there often occur displacements between the slices 152 which make up the memory unit 150, resulting in shifts of the slices 152 relative to the expected locations of the regular array of fine pitch joins 182 and hence distortion between the logic grid connection 180 and the wire leads 156 to which the logic grid connection 180 is assigned. Distortions may occur as height drifts (i.e., in memory wafer and bonding layer thickness, i.e., x direction in FIG. 1) and/or edge shifts (leads 156 misaligned between memory slices 152 i.e., z direction in FIG. 1). The relative distortion is unique for each slice 152, but consistent, or nearly consistent for each lead 156 and fine pitch connection 182 on a given slice 152. Note the distortions, or misalignments, in the y direction can be accommodated by extending leads 156 along that direction for a sufficient distance into a region above and below the memory banks 154, or other functional units on the slices, such that after the processing is complete, the upper and lower wiring surfaces of the memory unit 150 intercept the extended lead region of all the slices 152 which are joined together. This distortion correction, or tolerance, region along the y direction to which the leads are extended, is designated by the labels 190. Sample distortion and correction leads are shown and described further herein.

The logic-memory connection of the logic unit 110 and memory unit 150 will now be described in an exemplary embodiment. As indicated above, distortions often occur as a result of the stacked memory building process. These distortions may cause a disconnection between the logic grid connections 180, if they are configured on the memory slices 152 according to a pre-determined, expected location of the leads 156, since the actual positions of the leads 156 are misaligned. In an exemplary embodiment, a process to analyze and identify one or more skew values representing this misalignment or positional shift and determine an alignment correction or mitigation solution is provided to produce a customized logic grid connection 180, to connect the wire leads 156, and the regular array of fine pitch joins 182. Once the solution is determined, the exemplary process including but not limited to laser writing, or other mask-less patterning methods such as electron beam lithography, ion beam lithography, probe tip lithography, or projection lithography using a spatial light modulator, is utilized to form custom connection leads 180 between the wire leads 156 and the corresponding regular array of fine pitch joins 182 according to the process analysis and solution. This exemplary process is described further herein.

This alignment correction analysis and solution methodology may also be applied to discovered misalignments on the lower wiring surface of the memory slices 152 to form customized wiring connections 172 connecting the memory unit 150 to the I/O components by means of the corresponding C4 pads 170.

Turning now to FIGS. 2A-2D, 3A-3B, 4, and 5, an exemplary process and system for building the logic-memory device 100 will now be described in an exemplary embodiment.

Figure 4:
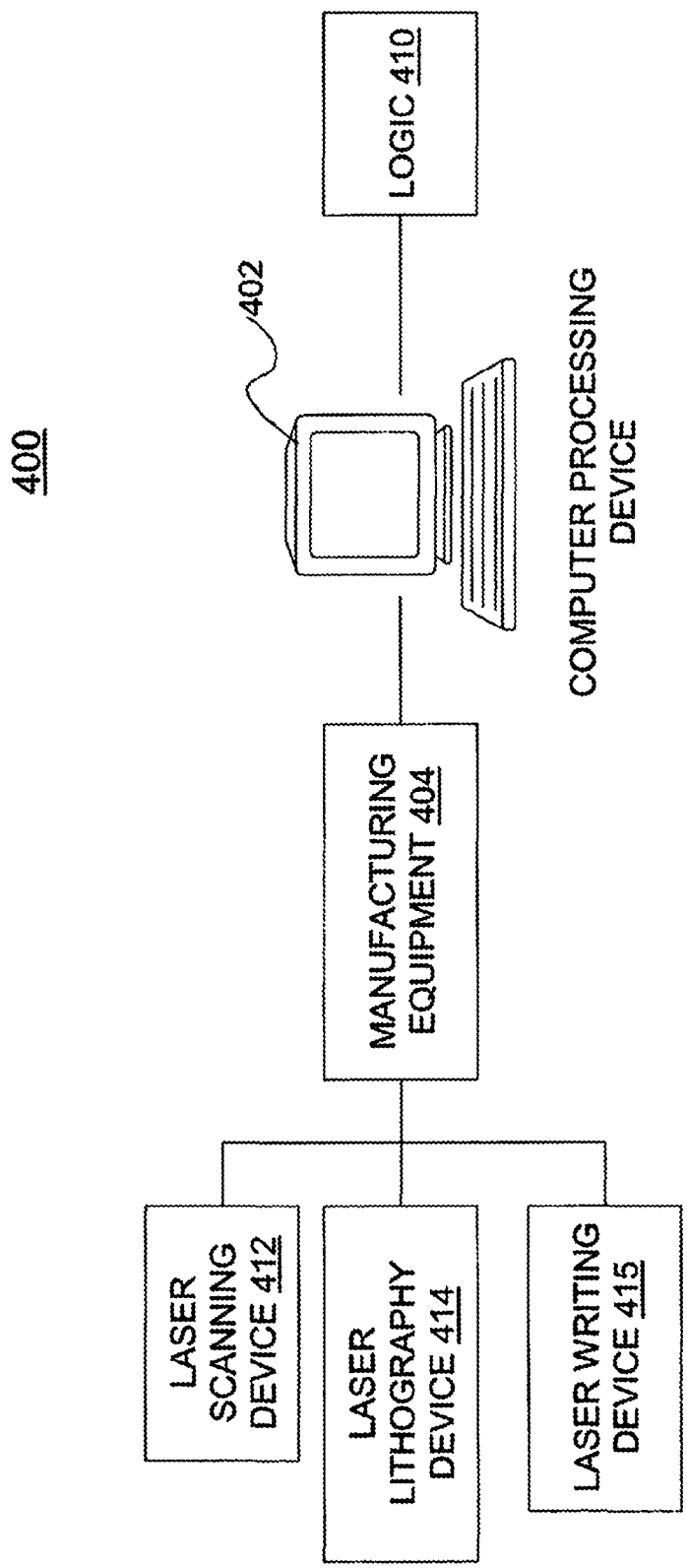
FIG. 4 is a block diagram of a system in which logic-memory devices may be manufactured in an exemplary embodiment.

A system for building the logic-memory device 100 is shown in FIG. 4. The system 400 of FIG. 4 includes a computer processor 402 and manufacturing equipment 404. The computer processor 402 may be a general purpose computer (e.g., desktop, laptop, etc.) or may be a high-performance computer (e.g., mainframe). The computer processor 402 communicates with the manufacturing equipment 404 through logic 410 executing thereon. The manufacturing equipment 402 may include known machines used in building logic-memory devices and related components as is generally understood in the art. The manufacturing equipment 404 may also include a laser scanning device 412 (for pattern recognition), a laser lithography device (e.g., a data process unit 414 that configures the recognized pattern with distortion into perfect grids), and a laser direct writing device 415 (which implements the correction from distorted patterns into perfect grids). The laser scanning device 412 monitors alignment (top and edge; x and z) of a memory stack processed in the logic-memory building process described herein. The laser lithography (data processing unit) device 414 creates the logic grid connections 180 patterns on the upper wiring surface of the memory slices 152. The laser writing device 416 writes connections on the memory slices 152 to correct identified skews between the logic grid connections 180 between the leads 156 and fine pitch joins 182. These devices will be described further herein where the identifying numbers cited are from FIG. 1.

The logic unit 110 may be created via known semiconductor chip manufacturing methods known in the art (e.g., the logic unit 110 may be a processor and/or crossbar logic wafer or chip). The logic unit 110 may include, e.g., a chip with 32×32 processors, whereby each processor in the chip includes four or more cores or it may include multiple crossbars to provide for communications between processor units located in the vertically orientated slices 152.

The memory unit 150 may be manufactured according to 4DI process design methods. The 4DI manufacturing process is a parallel process comprising a single manufacturing step with respect to the memory stack creation. In this process, the signals and power/control 156 wires are built into each of the memory wafers prior to stacking. In one exemplary embodiment, memory unit 150 includes 64 memory slices 152 and each processor in the logic unit 110 is configured to access two memory slices 152. In the case of a 32×32 processor array on a 24×24 mm chip, this memory bank width is 24/32=0.75 mm. Since each processor has four cores and each processor can access two slices 152 at 0.75 mm width, each core will have access to a 0.375 mm wide (along z direction in FIG. 1) section of a memory slice. If, for example the memory slice is 3 mm tall (along y direction in FIG. 1), the available memory area per core would be 1.125 mm². This amounts to over 20 times the memory available for each logic core than a conventional 2D chip could provide. In the 0.375×0.75 mm area on the top surface of the memory unit 150 which is aligned with a single core, with a 75 micron pitch areal array, a total of 50 fine pitch joins 182 can be formed. These fine pitch joins can be used for signals, power, ground, controls, etc. The use of finer pitch for the joins 182 will result in an increased number of connections between memory unit 150 and logic unit 110. In an alternative embodiment, the memory unit 150, e.g., may include 128 memory slices 152 and each processor in the logic unit 110 is configured to access four memory slices 152.

The memory wafers may be thinned such that each wafer's thickness has ratio of slice to core of 1:1, 1:2, or 2:1, such that it provides a physical partition between the logic core and memory slices. The memory wafers are then stacked and aligned, and bonded.

An edge laser (e.g., laser scanner 412) may be used to monitor wafer shift and a top laser (e.g., laser scanner 412) may be used to monitor misalignment due to changes in wafer thickness (e.g., top laser monitors concave/convex fluctuation). The edge and top laser devices may be optical imaging lasers.

The memory slice thickness is determined by the length of the processor chip (cores) in such a way that each core has its own private memory bank or banks. The additional system I/O and power/ground returns are normally a small fraction of the local I/O needs and they can be inter-dispersed among the leads 156 on memory slices 152 that are connected to memory devices.

The 24 mm memory wafer stack is cut via the manufacturing equipment 404 into 3 mm wide strips (which becomes the memory height after flip to vertical position) and 24 mm long (logic length) blocks in the pre-determined locations for dicing. The memory height may be, e.g., 2 mm-20 mm depending on the amount of memory needed for each core. The diced chip size can range from 5 mm×5 mm to 50 mm×50 mm. The logic chip 112 can also be thinned from 730 micron to 20 micron for better thermal dissipation prior to dicing. The total memory densification with such configuration can be over 50 times that of a conventional 2D unit.

The memory slices 152 are flipped in the 3 mm (or other height) direction with one edge (i.e. the upper wiring surface) facing the logic wafer 110 and the other edge (i.e., lower wiring surface) facing the I/O components. The upper wiring surface of the memory slices 152 will attach to the logic unit 110 via microbumps, or fine pitch joins 182 and the lower wiring surface of the memory slices 152 will receive the system I/O (e.g., C4s 170) and connect to a package substrate (not shown).

Figure 2A:
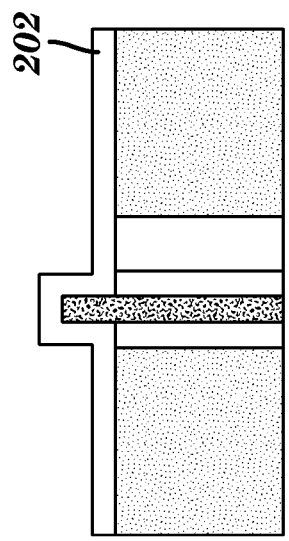
FIGS. 2A-2D are diagrams depicting cross sectional views of a portion of a manufacturing process used in building a vertical memory unit in an exemplary embodiment.
Figure 2B:
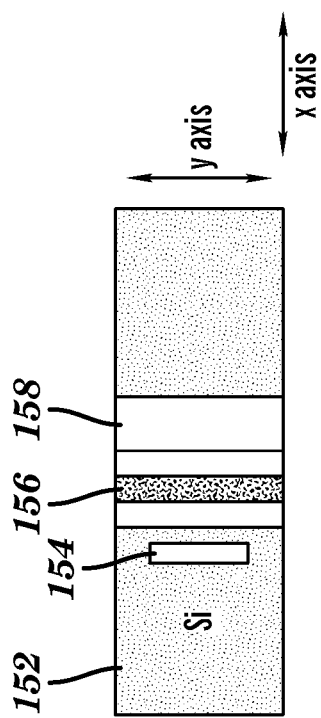
Figure 2C:
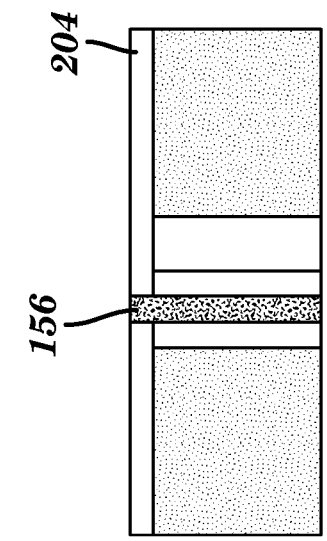
Figure 2D:
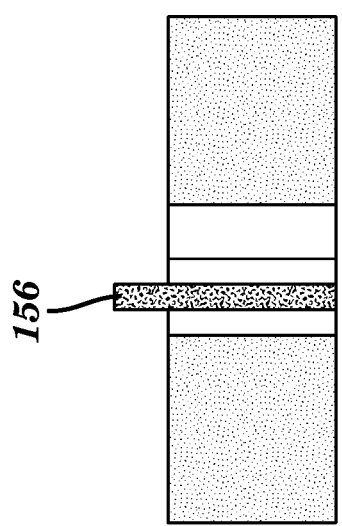

The memory slices 152 are placed on a square carrier (such as a blank Si) in grids (e.g., using wafer notches and grooving) and may be secured using epoxy. The gaps between the slices 152 may be filled with a high temperature stable filler, such as benzocyclobutane (BCB) or polyimide. The top surface of the memory slices 152 is planarized with chemical mechanical polish (CMP) grind/polish to remove the wafer slice damage layer (to 50 micron) and expose the memory leads 156 (FIG. 2A, which corresponds to a side view of FIG. 1, in the x-y plane). The Si/oxide may be recessed by 1-5 micron using selective reactive ion etch (RIE) below the leads (e.g., Cu wires) 156 (FIG. 2B). The memory unit 150 upper wiring surface may be capped with 1-2 micron oxide layer 202 (FIG. 2C). A surface planarization coating may be used to fill potential gaps formed during bonding. A knock-off polish may be used on the oxide layer 202 to expose the leads 156 for connection while leaving the planarized oxide layer over the Si for insulation (FIG. 2D).

Figure 3A:
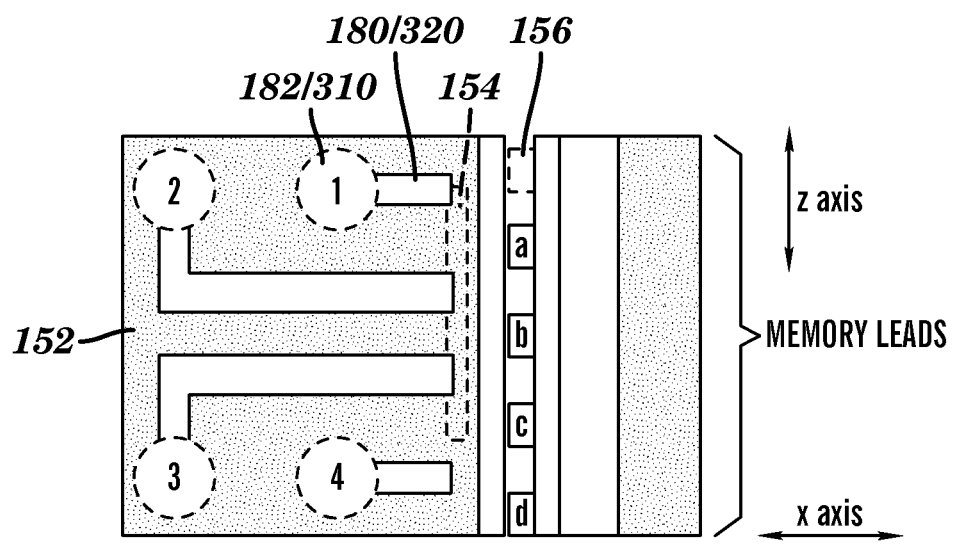
FIG. 3A is a diagram illustrating a top view of a vertical memory unit in an exemplary embodiment.

As shown in FIG. 3A, which is a top down view of part of the memory unit 150 in the x-z plane (i.e., the upper wiring surface), the top surface fan-outs (logic grids 180) are fabricated and extend from logic grid pads 310 to an edge of the upper wiring surface of the memory slice 152 that is closest to the leads 156. The logic grid pads 310 represent locations on the upper wiring surface of the memory slice 152 which are in alignment with logic units 114 of the logic unit 110, and which locations are used to form the fine pitch joins 182. The fan-outs may be fabricated using a negative tone resist for sub-etching (this can also be a positive tone resist for back end of line (BEOL) damascene or dual damascene process). The upper wiring surface of the memory slice 152 is covered, e.g., with a 1 micron Cu by sputtering. The upper surface is then coated with 1 micron of negative resist which is then exposed and patterned in desired areas (i.e., logic grids 180) with a Cu etch. In the case of a damascene process, layers of nitride and oxide dielectrics are first added on top of the Cu leads 156. The wire trench pattern is photolithographically defined and aligned to the leads 156. Reactive ion etch (RIE) is used to open the trench pattern into the nitride/oxide layers to reach the leads 156. A layer of liner and seed (for example, Ta, TaN, and Cu) are deposited into the trench to make contact with the leads 156. Additional Cu is plated and then polished via CMP to form filled Cu wire trenches in the oxide dielectrics (this is called a damascene process).

Figure 3B:
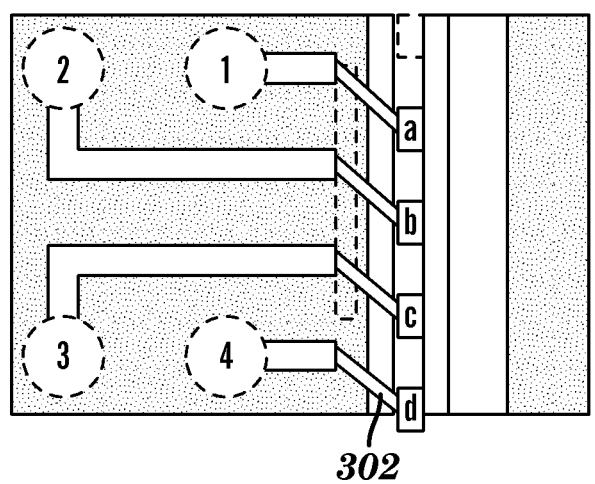
FIG. 3B is a diagram illustrating a top view of a vertical memory unit with distortions corrected using same level fan-out correction in an exemplary embodiment.

Due to the assembly shift, the leads 156 may misalign between the slices 152. In an exemplary embodiment, a direct laser write method is used to correct the misalignments (laser direct write corrections 302 are shown in FIG. 3B). In an exemplary embodiment, the logic 410 may be configured to find each of the memory slice 152 current leads' 156 locations (e.g., a, b, c, d in FIG. 3B) via the laser scanning device 412 and re-write them to a fixed grid (i.e., logic grids 320 corresponding to logic grid connections 180) (e.g., via the laser writing scanner 415) on the upper wiring surface of the memory slice 152. For example, the misalignment may be determined during the bonding process (e.g., via the edge and top laser monitors) and the exemplary process determines the correct placement of the leads 156, then uses the placement of the logic grids 320 to write to the existing location of the leads 156. As noted above, the direct write corrections 302 will be different for each slice 152, unless the relative displacement compared to the fine pitch connections 180 are identical.

Figure 5:
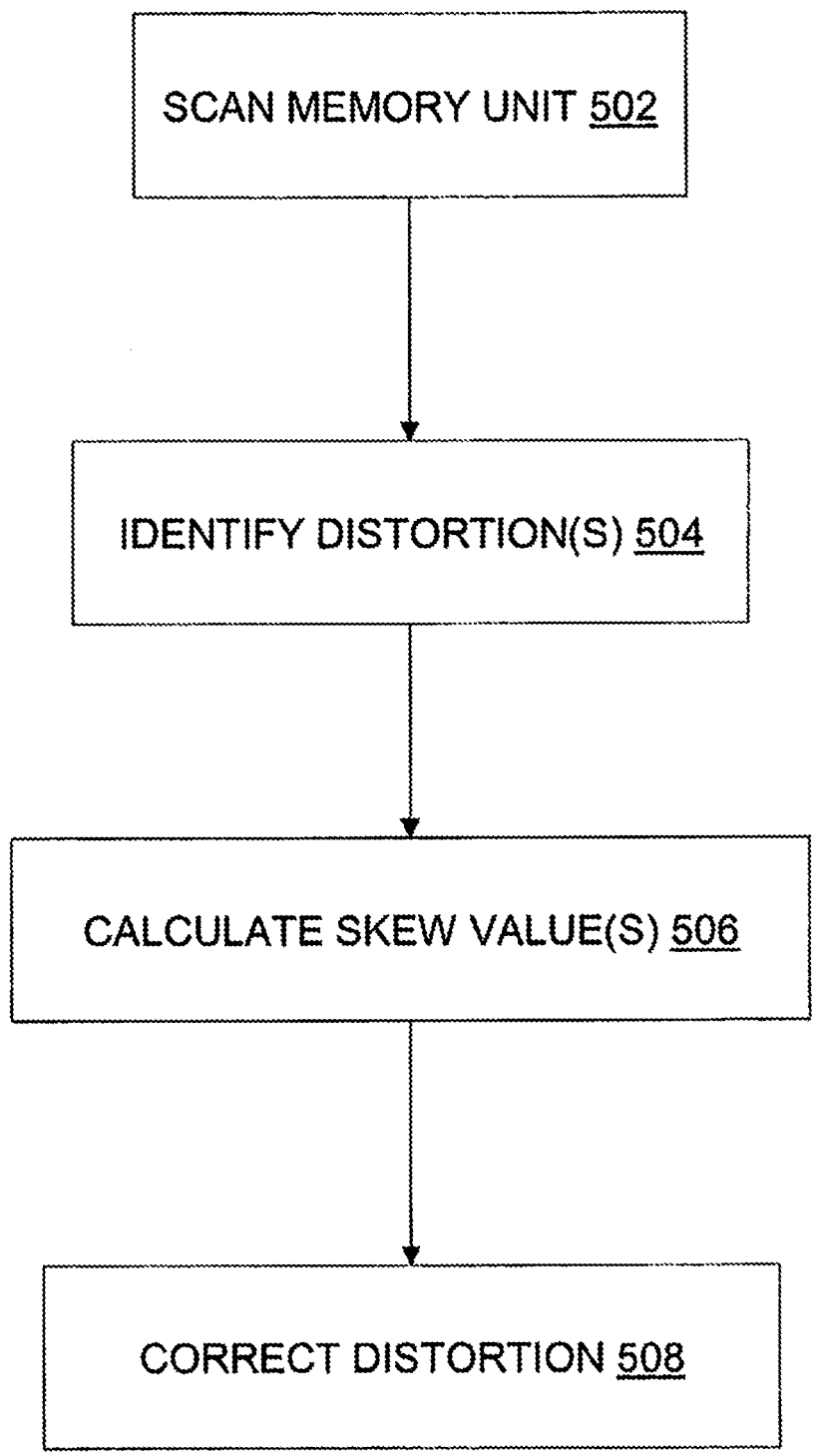
FIG. 5 is a flow diagram describing a process for identifying and correcting distortions in a memory unit in an exemplary embodiment.

Turning now to FIG. 5, a flow diagram describing a process for identifying and correcting distortions in a memory unit will now be described in an exemplary embodiment. At step 502, the manufacturing equipment 404 scans the memory unit (e.g., via laser scanning device 412). At step 504, the manufacturing equipment identifies any distortion (edge z in FIG. 1, or height/thickness, x in FIG. 1, misalignments) resulting from the scanning performed in step 502 via the logic 410. At step 506, the manufacturing equipment 504 calculates a skew value representing the distortion via the logic 410. The laser writing device 515 may write the correction from the skew value taken in conjunction with the current and expected locations of the leads 156 of the memory unit at step 508.

Figure 6:
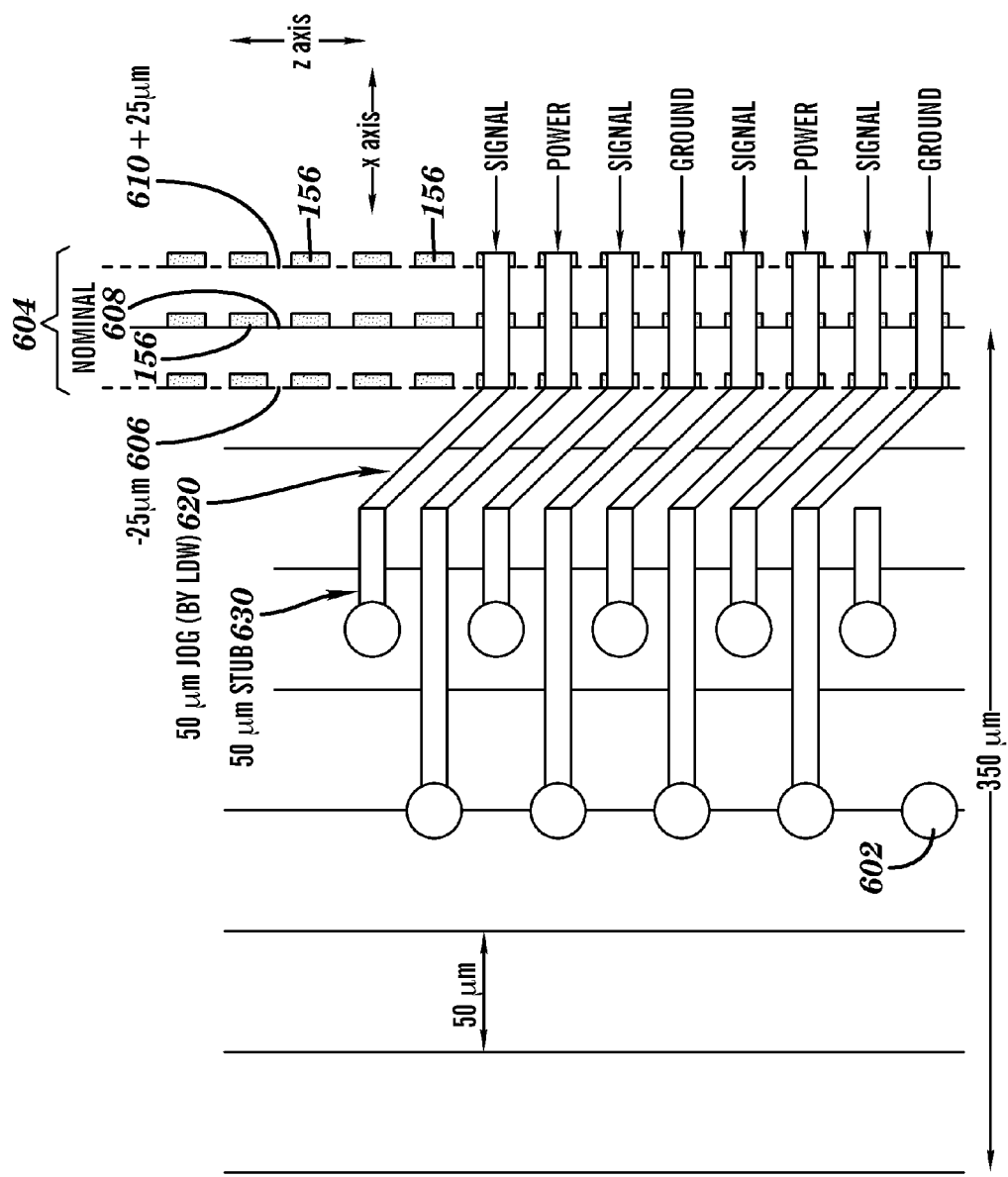
FIG. 6 is a graphical representation of logic grid connections and sample laser write connections based upon distortions identified in a vertical memory unit according to an exemplary embodiment.

As shown in FIG. 6, logic grid connections and sample laser write connections for a number of I/O leads 156 based upon distortions identified in a memory unit will now be described. The laser direct write correction leads consist of several components. For distortions comprising edge shifts (i.e., leads 156 misaligned between memory slices 152, also referred to as "x positional shifts"), an 'x' position 608 is the "ideal" position of the I/O leads 156 in which no positional shift or misalignment is found. Due to the variations in the thickness of the slices 152 or the bonding adhesive 158, this position may be shifted to locations along the x axis within a certain range of the ideal position 608. As shown, e.g., in FIG. 6, a 50 micron range allows for a +25 micron shift identified as position 610 (e.g., shift to the right) or a −25 micron shift identified as position 606 (e.g., shift to the left) from the ideal position 608. To anticipate such x positional variations, a portion of the laser direct write correction leads have an x-positional correction segment ranging from −25 micron to +25 micron, so that as long as the I/O leads 156 are located within the −25 micron and +25 micron ranges, the laser direct write correction leads will capture the IO leads 156. Positions of 606, 608, and 610 are collectively referred to as 'x' positions 604.

Another component of the laser direct write (LDW) correction leads is a z-position segment 620, which represents a distortion that occurs as an alignment shift (i.e., in memory wafer stacking and bonding). The z-position segment 620 is indicated in FIG. 6 by "50 micron jog (by LDW)." A z-positional distortion/correction is represented as an angle via the segment 620. Thus, these slanted segments 620 provide z-positional corrections. If the z-position is "ideal" (i.e., no z-position shift) the slant angle will be zero degrees; parallel to the x axis. The larger the z-positional shift, the greater will be the slant angle, such that the left end of the slants always ends at the "ideal" z-position (no z shift). As shown in FIG. 6, the z-correction segment 620 may occupy 50 microns width in x-direction so that an equivalent the equal amount of z-correction can be achieved with a 45 degree slant segment 620.

Also shown in FIG. 6 is a "50 micron stub" 630. This is the standard fan-out wire if no x- and y-positional shifts are found, allowing the I/O leads 156 to be converted from line array into an area array (i.e., grid 602). With the x-(606, 608, 610) and z-(50 micron jog) positional corrections, the distorted I/O leads 156 can be direct laser wired to their area grid 602. Thus, e.g., a write correction, such as correction 302 (lead 'd') of FIG. 3B may be implemented as an x and/or z positional correction (depending upon the distortion), and the wire 302 (lead 'c') of FIG. 3B may be implemented as an x and/or z correction plus fan-out. Note that other designs are possible using mask-less patterning to connect the leads 156 to the area array grid location pads 602 and fine pitch joins 182 and the schemes described above are illustrative examples. In addition, pads 602 and stubs 630 may be formed using conventional lithography and patterning while jogs 620 and x position correction leads 604 may be produced by laser direct write or other similar mask less lithography.

While laser direct write corrections write wires for positional corrections, it can at the same time write wafer serial numbers, global and local alignment marks, and other features that allows accuracy overlay of the subsequent lead layers fabricated using conventional lithography on top of the first layer of leads. These additional lithography marks or features are also conveniently formed using the same process as the first layer of leads.

Once the corrections have been completed, the manufacturing process of the memory-logic device 100 continues. The fine pitch connection structure 182 is fabricated and disposed on the logic grid 180, e.g., using transfer and join (T&J) methods or other similar technique (such as attachment using solder microbumps, or other electrical connection methods).

In an exemplary embodiment, the logic unit 110 may be attached in wafer form or in chip form for known-good-die attachment. The logic unit 110 may be bonded to the memory unit 150, e.g., via lamination. Any gaps that may exist between logic chips may be filled as needed for die-on wafer connection.

The memory stack 150 and the logic chip 110 are one possible logic-memory structure. The other possible structures are that the memory stack 150 can itself contain memory and some of the logic cores. This can reduce the logic chip 110 complexity and can allow the logic 110 to contain both logic cores and the crossbars which provide a communication bus among all of the cores. Another possible structure is to have the memory and logic cores all in the memory stack 150 and to have one or more crossbars in logic chip 110 providing communications between the cores.

In an exemplary embodiment, fan-outs on the lower wiring surface of the memory slices 152 may be processed in a similar manner as that described above. I/O components (e.g., C4 interconnects) are added for connections to a packaging carrier for testing. The packaging carrier assembly may then be attached to the board for the final assembly and system test. The packaging substrate can be an organic card, a ceramic substrate or other suitable package substrate.

Technical benefits of the present inventive method include identifying and correcting distortions in a stacked memory unit discovered as a result of a memory stack building process. The distortion correction processes provide mask-less direct writing (e.g., using a laser) connections between logic grid connections and wire leads within a single memory unit in the memory stack to allow high density, high I/O bandwidth in close proximity to processor cores.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A chip stack structure, comprising:
   a logic chip having an active device surface;
   a plurality of memory slices of a memory unit, the plurality of memory slices vertically aligned such that an active device surface of the plurality of memory slices is oriented perpendicular to the active device surface of the logic chip; and
   wiring patterned on an upper surface of the plurality of memory slices, the wiring configured to correct distortions occurring from a slicing and assembly process of the memory slices, the wiring electrically connecting memory leads of the plurality of memory slices to logic grids corresponding to logic grid connections of the logic chip.

2. The chip stack structure of claim 1, wherein a portion of the upper wiring surface of the plurality of memory slices includes fanout wiring, and another portion of the upper wiring surface of the plurality of memory slices includes active electrical connections to and from the logic chip on the logic grid connections.

3. The chip stack structure of claim 2, wherein the portion of the upper wiring surface of the plurality of memory slices that includes the fanout wiring includes two regions, wherein each of the two regions corrects for the distortions in a direction that is parallel to the active device surface of the logic chip.

4. The chip stack structure of claim 3, wherein the fanout wiring in the first region is slanted to correct for the distortions, and the fanout wiring in the second region is oriented in a plane on an upper part of the plurality of memory slices and is perpendicular to the active device surface of the plurality of memory slices.

5. The chip stack structure of claim 1, wherein the plurality of memory slices each includes a tolerance region disposed on opposing ends of the plurality of memory slices.

6. A method of identifying and correcting distortions in a stacked memory unit resulting from a memory stack building process for a logic-memory device, the method comprising:
scanning the stacked memory unit, locating a position of each of a plurality of memory slices relative to a position of others of the plurality of memory slices resulting from the scanning, and calculating a skew value representing a difference between a current position of leads of the plurality of memory slices and a pre-planned position of the leads; and
responsive to determining a distortion exists from the scanning, correcting the distortion using the skew value by laser direct writing a connection between each of a plurality of logic grid connections and corresponding leads.

7. The method of claim 6, wherein the laser direct writing corrects the distortion between the logic grid connections and the corresponding leads within a single memory slice.

8. The method of claim 6, further comprising:
configuring input/output connections on a lower surface of each of the plurality of memory slices, the input/output connections configured to align with input/output interconnect components of the logic-memory device; and
responsive to determining the distortion exists from the scanning, correcting the distortion using the skew value by laser direct writing a connection between each of the input/output connections and corresponding interconnect components.

9. The method of claim 6, wherein the distortion is identified using an optical laser.

10. The method of claim 6, wherein the connection is written using direct laser lithography.

11. The method of claim 6, wherein the logic-memory device is a four-dimensional integration device.

12. The method of claim 6, wherein the distortion occurs along a first axis, and the skew value represents a shift misalignment among the plurality of memory slices during a stacking step in the memory stack building process.

13. The method of claim 6, wherein the distortion occurs along a second axis, and the skew value represents a variation in thickness of the plurality of memory slices during a memory wafer thinning step in the memory stack building process.

14. The method of claim 6, wherein the correcting is implemented across multiple lead layers.

15. A chip stack structure, comprising:
a crossbar chip having an active device surface;
a plurality of combined memory and processor slices of a processor memory unit vertically aligned such that an active device surface of the plurality of the combined memory and processor slices is oriented perpendicular to the active device surface of the crossbar chip, wherein electrical interconnects are formed between devices on the active device surface of the crossbar chip and devices on the active surface of the plurality of combined memory and processor slices by connections on an upper wiring surface of the plurality of combined memory and processor slices.

16. The chip stack structure of claim 15, wherein a portion of the upper wiring surface of the plurality of combined memory and processor slices includes fanout wiring connections, and another portion of the upper wiring surface of the plurality of combined memory and processor slices includes active electrical connections to and from the crossbar chip.

17. The chip stack structure of claim 16, wherein the portion of the upper wiring surface of the plurality of combined memory and processor slices that includes the fanout wiring further includes two regions, wherein each of the two regions corrects for the distortions in a direction that is parallel to the active device surface of the logic chip.

18. The chip stack structure of claim 17, wherein the fanout wiring in the first region is slanted to correct for the distortions, and the fanout wiring in the second region is oriented in a plane on an upper part of the plurality of combined memory and processor slices and is perpendicular to the active device surface of the plurality of combined memory and processor slices.

19. The chip stack structure of claim 17, wherein the plurality of combined memory and processor slices each includes a tolerance region disposed on opposing ends of the combined memory and processor slices.

* * * * *